United States Patent [19]

Yabe et al.

[11] 3,742,314

[45] June 26, 1973

[54] SEMICONDUCTOR OSCILLATING ELEMENT

[75] Inventors: Masaya Yabe; Teizo Takahama; Masaru Kono; Katsumi Hirono, all of Kawasaki, Japan

[73] Assignee: Fiyi Denki Seizo Kabushiki Kaisha, Kanagawa-ken, Japan

[22] Filed: July 22, 1971

[21] Appl. No.: 165,185

[30] Foreign Application Priority Data

July 24, 1970 Japan ............................... 45/64883
Apr. 16, 1971 Japan ............................... 45/24368

[52] U.S. Cl.. 317/234 R, 317/234 UA, 317/235 K, 317/235 AB

[51] Int. Cl. ............................................ H011 11/10

[58] Field of Search .................. 317/235 AB, 235 K, 317/235 AA, 234 UA

[56] References Cited

UNITED STATES PATENTS 3,284,723 11/1966 Hinkels ........................ 317/235 AB

*Primary Examiner*—John W. Huckert
*Assistant Examiner*—William D. Larkins
*Attorney*—Holman & Stern

[57] ABSTRACT

A semiconductor oscillating element comprising a semiconductor wafer which is provided with a first region of a conductivity type, a second region of a reverse conductivity type, a pn junction formed between said two regions, an injection electrode means provided on said first region at a specific distance from said second region, a first ohmic contact-electrode means provided on said first region at specific distances, respectively, from said second region and from said injection electrode means, and a second ohmic contact-electrode means provided on said first region so as to be near said injection electrode means. Furthermore, various modifications of the semiconductor oscillating element mentioned above and operation circuits utilizing said elements are also disclosed.

5 Claims, 15 Drawing Figures

SEMICONDUCTOR OSCILLATING ELEMENT

BACKGROUND OF THE INVENTION

A new semiconductor oscillating element adapted for a device capable of generating an oscillating voltage or an oscillating current, or adapted for a device converting a physical quantity into an oscillating frequency has been already proposed. This oscillating element comprises a semiconductor wafer which is provided with a first region of a conductivity type, a second region of a reverse conductivity type, a pn junction formed between said two regions, an injection electrode means provided on said first region at a specific distance from the said second region, and an ohmic contact-electrode means provided on said first region at specific distances, respectively, from said second region and from said injection electrode means.

SUMMARY OF THE INVENTION

It is a primary object of the present invention to improve the above-mentioned semiconductor oscillating element and more particularly to improve said element by adding thereto a particular means adapted to control the oscillating frequency of said element or to decrease or eliminate frequency variation caused by variation of the temperature of the element.

Another object of the present invention is to provide improved modifications of the above-mentioned semiconductor oscillating element and various circuits utilizing said improved elements.

A further object of the present invention is to provide various applications of the semiconductor oscillating element according to the invention.

The above and other objects of the invention have been attained by a semiconductor oscillating element comprising a semiconductor wafer which is provided with a first region of a conductivity type, a second region of a reverse conductivity type, a pn junction formed between said two regions, an injection electrode means provided on said first region at a first distance from said second region, said first distance being of the same order as the diffusion length of the minority carriers within said first region, a first ohmic contact-electrode means provided on said first region at a second distance from said second region, said second distance being of the same order as the diffusion length of said minority carriers and at a third distance from said injection electrode means, said third distance being sufficiently large in comparison with diffusion length of said minority carriers, and a second ohmic contact-electrode means provided at near said injection electrode means.

The nature, utility, principle and application of the present invention will be more clearly understood from the following detailed description with reference to the accompanying drawings, in which like parts are designated by like reference numerals.

DETAILED DESCRIPTION OF THE INVENTION

Figure 1:
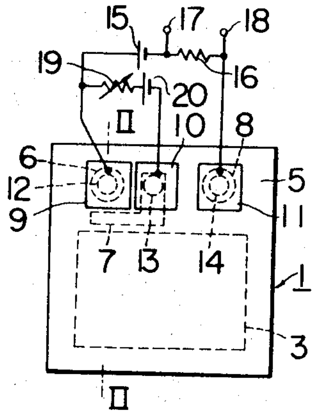
FIGS. 1, 3, 5, 7, 9 and 10 are, respectively, plane views illustrating the various shapes and operation circuits of different applications of the semiconductor oscillating element according to the present invention.
Figure 2:
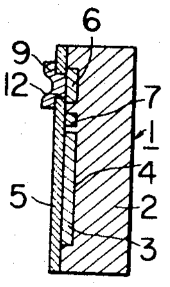
FIGS. 2, 4, 6, 8 and 11 are respectively sectional views along line II—II in FIG. 1, line IV—IV in FIG. 3, line VI—VI in FIG. 5, line VIII—VIII in FIG. 7 and XI—XI in FIG. 10.

Referring to FIGS. 1 and 2, there is shown a semiconductor element comprising a semiconductor wafer 1 provided with a first region 2 of a reverse conductivity type, a second region 3 of a reverse conductivity type opposite to said first conductivity type, and a pn junction 4. The wafer is, for instance, made of n-type monocrystal silicon having a specific resistance of 30 Ω-cm, a surface dimension of 2 × 2 mm, and a thickness of 200 $\mu$. The region 3 is p type and is formed by selectively diffusing an element, for instance, boron of the third group of the periodic table through a hole opened through a $SiO_2$ film 5 formed on the surface of the semiconductor wafer, said region 3 having a surface area of about 1 $mm^2$ and a thickness of about 3 $\mu$. The specific resistance of the region 3 along the surface of the wafer is, for instance, 0.01Ω-cm and is extremely lower than that of the region 2 having the original n-type conductivity of the wafer 1. In addition to the region 3 the region 2 is provided with regions 6, 7 and 8, said additional regions being formed, as in the case of the region 3, by selective diffusion of an impurity element through holes opened in the film 5. The region 6 has the same conductivity type as that of the region 3, that is, p type in this illustration and is formed together with the region 3 by diffusion of boron. On the other hand, the regions 7 and 8 have, respectively, lower specific resistances and the same conductivity type as that of the region 2, that is, n-type, said regions 7 and 8 being formed by diffusing an element, for instance, phosphorus of the fifth group of the periodic table. The distances of the regions 6 and 8 from the region 3 are selected to be substantially the same as the diffusion length of the minority carrier, that is, the hole in the region 2.

More particularly, if the diffusion length of the minority carrier in the region 2 is of the order of 80 – 140 $\mu$, the distance between the regions 3 and 6 is selected to be about 100 $\mu$ and that between the regions 6 and 8 is selected to be about 100 to 200 $\mu$. The distance between the regions 6 and 8 is selected to be sufficiently large, for instance, to be 850 ∞ in comparison with the diffusion length of the minority carrier in the region 2. Furthermore, the region 8 is formed so as to have a small diameter, for instance, about 50 $\mu$ in its diameter so that an electric field may be concentrated in the vicinity of said region 8 when operation is carried out. The region 7 has a L-shaped form and is partly extended to the region between the regions 3 and 6. The regions 6, 7 and 8 are provided with ohmic contact-electrodes 9, 10 and 11 formed for instance, by evaporation of aluminum through holes 12, 13 and 14 opened in the oxide film 5, respectively. The region 6 and the electrode 9 form an injection electrode means for injecting positive holes in the n-type region 2 when a forward bias voltage is applied to the pn junction provided between the regions 6 and 2. The region 7 and the electrode 10 form a second ohmic contact-electrode means, and the region 8 and the electrode 11 form a first ohmic contact-electrode means.

For operating the semiconductor oscillating element mentioned above, a predetermined voltage is applied across the electrodes 9 and 11 in such a manner that carriers are injected into the region 2 by the injection electrode means, that is, a forward bias voltage is applied to the pn junction between the regions 2 and 6, whereby an oscillating current superimposes the current from the electrodes 9 and 10.

An oscillating circuit utilizing the semiconductor oscillating element shown in FIGS. 1 and 2 is also illustrated in FIG. 1, in which a voltage is applied across the electrodes 9 and 11 from an electric power source 15 so that polarities of the electrodes 9 and 11 are, respectively, positive and negative. A resistor 16 is connected in series with the power source 15 and an output voltage corresponding to current flowing through the power source 15 is produced between the terminal 17 and 18 provided on both ends of said resistor 16. Furthermore, a variable resistor 19 and a voltage source 20 are connected between the electrodes 9 and 10, said variable resistor 19 and power source 20 not being indispensable for oscillating element. Therefore, operation of the state in which the electrodes 9 and 10 are opened will be initially described and then operation of the state in which the variable resistor 19 and voltage source 20 are connected between the electrodes 9 and 10 will be described, as follows.

When the voltage applied between the electrodes 9 and 11 from the power source 15 is gradually increased from zero, so far as the applied voltage is below a lower limit value, only a small d.c. current flows, but upon exceeding the lower limit value an oscillating current is generated and superimposed on said small d.c. current. The frequency of the oscillating current varies continuously with increase of the applied voltage, and the oscillation ceases at a certain upper limit value, thus causing only large d.c. current.

For example, when the applied voltage is increased, the oscillating current appears at 2.2 volt and disappears at 80 V. During the increase of the applied voltage from 2.2 V to 80 V, the oscillation frequency increases substantially linearly from 1 MHz to 1.5 MHz.

Figure 12:
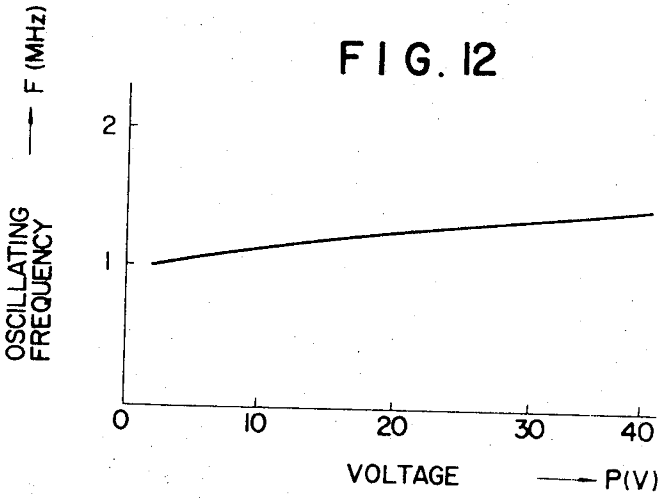
FIG. 12 is a graphic diagram showing relationship between the applied voltage and oscillating frequency of the semiconductor oscillating element shown in FIGS. 1 and 2.

A dependence of the oscillating frequency on the applied voltage in a sample is shown in FIG. 12, in which the abscissa represents the applied voltage P(V) and the ordinate the oscillating frequency F(MHz).

Figure 13:
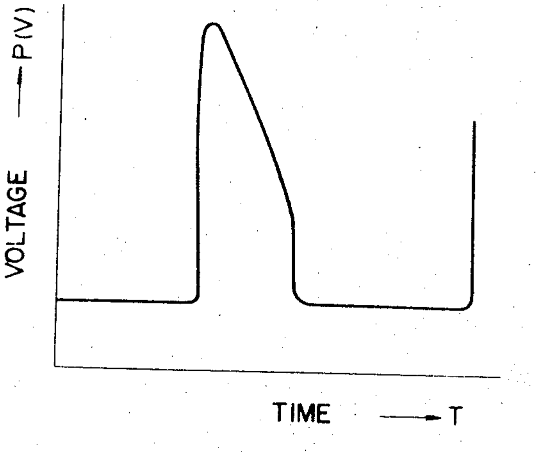
FIG. 13 is a graphic diagram showing the waveform of an output voltage in the device shown in FIG. 1.

FIG. 13 illustrates an waveform of the oscillating current passing through the electrodes 9 and 11, namely, a voltage waveform produced across the terminals 17 and 18 of the device illustrated in FIG. 1.

In FIG. 13, the abscissa represents time T and the ordinate voltage P.

It is considered that the occurrence of the abovementioned oscillating phenomenon in the semiconductor element illustrated in FIGS. 1 and 2 is based on the following reasons.

At a moment when a voltage is applied across the electrodes 9 and 11, a rush current flows from the region 6, through the region 2, to a capacitor composed of the reverse biased pn junction 4 formed between the regions 2 and 3, and further from the side edge portion of the region 3, confronting to the region 8, through the region 2, to the region 8. When the voltage of the power source 15 is sufficiently high, a conductivity modulation is caused by positive holes injected into the region 1 from the side edge portion of the region 3, confronting to the region 8, upon flowing of the rush current, whereby potential of the region 3 is rapidly decreased, thus causing quick charging of the capacitor.

With elapse of time, the charge of the capacitor increases and the charging current decreases. When this charging current becomes lower than a certain value, the conductivity modulation ceases and the current decreases to a small residual current. On the other hand, some part of the positive holes injected from the region 6 into the region 2 diffuses into the region 3 through the region 2. In this case, since the distance between the region 6 and 3 is large enough to be substantially equal to the diffusion length, the quantity of the positive holes flowing into the region 3 is relatively small, and as a result of which the action of said holes is not significant during the rush current flowing process. However, the potential of the region 3 is negative with respect to the region 1 even after disappearing of the rush current, so that transfer of the holes to the region 3 is continued and the potential of the region 3 increases gradually. When this potential reaches a certain upper limit value, holes are injected toward the region 2 from the side edge portion of the region 3, confronting to the region 8, whereby the conductivity modulation is continuously induced and a current flowing to the region 8 from the region 6 through the region 2 increases rapidly. Hereafter, the operation of the semiconductor oscillating element is cyclically conducted in accordance with the above-mentioned processes.

Next, a description will be given in connection with the operation of the case in which a variable resistor 19 and a voltage source 20 are connected between the electrodes 9 and 10.

The region 7 to which the electrode 10 is connected exists between the regions 6 and 3 and controls minority carriers injected from the region 6. Namely, as shown in FIGS. 1 and 2, when the electrodes 9 and 10 are respectively connected to the positive and negative poles of the voltage source 20, injection of the minority carrier into the region 2 from the region 6 increases, so that the oscillating frequency increases with decrease of the resistance value of the variable resistor 19 and with increase of the applied voltage.

Figure 14:
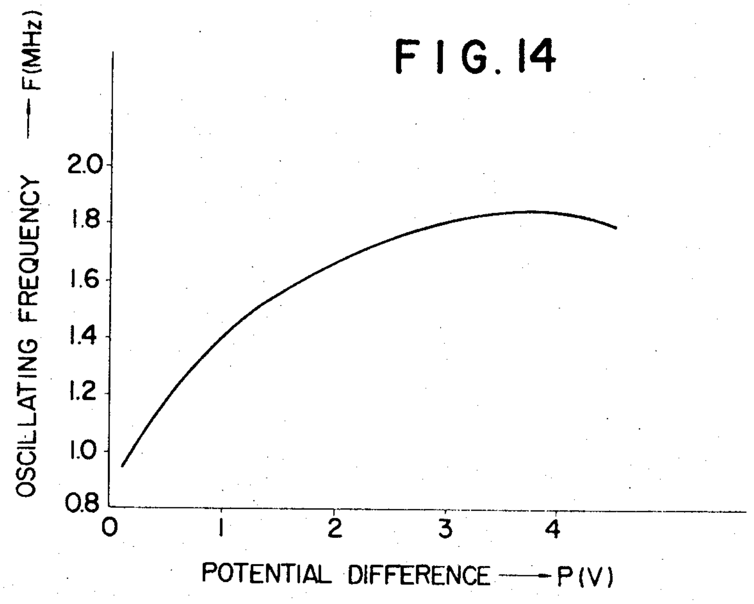
FIG. 14 is a graphic diagram showing variation of oscillation frequency in the case where the control voltage is varied in the device shown in FIG. 1.

When a predetermined voltage is previously applied across the electrodes 9 and 11 thereby to establish an oscillation and then a voltage is applied across the electrodes 9 and 10, the oscillating frequency varies with the latter voltage as shown in FIG. 14.

In FIG. 14, the abscissa represents potential difference P(V) of the electrode 9 with respect to the electrode 10, and the ordinate represents the oscillating frequency F(MHz).

As mentioned above, in the case of the device shown in FIG. 1, adjustment and establishment of the oscillating frequency can be effectively attained by utilizing the variable resistor 19 or a conversion device capable of converting a physical quantity to a frequency can be obtained by utilizing a particular resistor, the resistance value of which is varied in response to a suitable physical quantity such as the variable resistor 19, said particular resistor being illustrated by a magnetic resistance element, a photo-resistor, a thermistor or the like.

Figure 3:
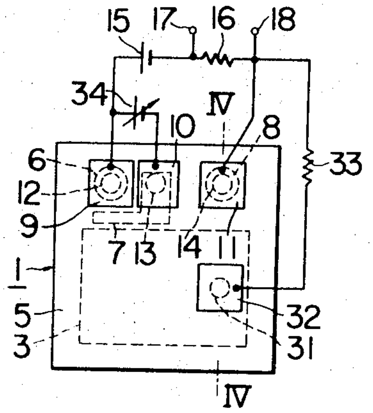
Figure 4:
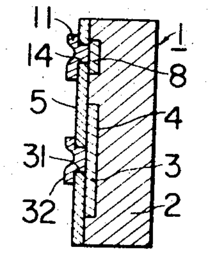

The semiconductor oscillating element shown in FIGS. 3 and 4 is basically same as that shown in FIGS. 1 and 2 except that a hole 31 is formed in the oxide film 5 and an electrode 32 formed by evaporation of a metal such as aluminum makes ohmic contact with the exposed P type region 3. In the circuit shown in FIG. 3, the electrode 32 is used for controlling the oscillating frequency, namely a resistor 33 is connected between the electrodes 32 and 11. This resistor 33 may be connected between the electrodes 32 and 9, and at any rate, oscillating frequency controlling characteristics having respective features corresponding to the manner of connection can be obtained. Namely, according to the connection shown in FIG. 3, no oscillation would occur unless the resistance value of the resistor 33 is larger than several hundred kilo-ohm. When said resistance value is increased above said value, an oscillation occurs and its frequency increases to the upper limit value. On the other hand, when the resistor 33 is connected between the electrodes 9 and 32, it is possible to produce an oscillation by adjusting the resistance value of said resistor to a value more than several kilo-ohm to several tens of kilo-ohm, but the frequency of said oscillation decreases gradually with increase of the resistance value of said resistor.

It is also possible to connect a capacitor in place of the resistor 33. In this case, a lower oscillation frequency can be obtained. Furthermore, it may be possible to connect a voltage source in place of the resistor 33, but in this case an entirely reverse effect can be obtained in accordance with the polarity of the voltage source. Namely, when the polarity of the voltage source corresponds to a forward bias with respect to the pn junction between the regions 2 and 3, the oscillation frequency increases with an increase of the voltage of the voltage source and, when said polarity corresponds to a reverse bias, the oscillation frequency decreases with an increase of said voltage. In this circuit, another voltage source 34 having variable voltage is additionally connected between the electrodes 9 and 10.

According to this circuit, it is possible to control minority carrier current injected into the region 6 by adjusting the output voltage of the source 34 and thereby adjusting the voltage applied across the electrodes 9 and 10, thus causing adjustment and controlling of the oscillating frequency as in the case of the previously described embodiments. In this circuit, adjustment of the oscillating frequency can be adjusted by means of both the variable voltage source 34 and an element connected between the electrodes 11 and 32; or it is possible (1) to convert a physical quantity to an oscillating frequency by fixing one of these variables at an oscillating condition and by controlling the other one in response to the physical quantity or (2) to obtain an oscillating voltage having a frequency responsive to two kinds of physical quantities by controlling both of said source and element.

Figure 5:
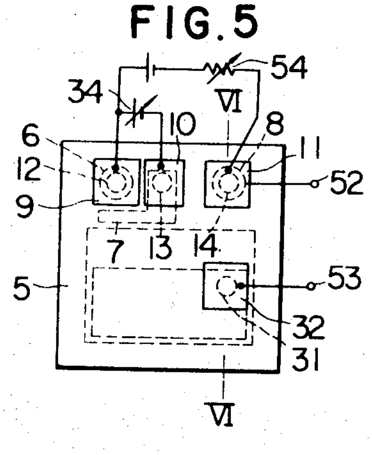
Figure 6:
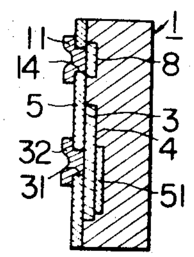

The semiconductor oscillating element shown in FIGS. 5 and 6 is substantially the same as that shown in FIGS. 3 and 4, except that a highly doped n-type region 51 is sandwiched between the regions 2 and 3. In the circuit shown in FIGS. 5 and 6, for instance, the n-type region 51 has a specific resistance of 0.1 Ω-cm, a thickness of 3 $\mu$ and an area of 0.5 mm$^2$. The region 51 is formed, prior to formation of the region 3, by deep selective diffusion of an element of the fifth group of the periodic table such as, phosphorous.

The region 51 functions in such a manner that when a reverse bias voltage is applied to the pn junction surface formed between the regions 2, 51 and 3, spreading of the depletion layer toward the region 2 can be suppressed by said region 51, thereby to maintain the capacity of the capacitor composed of the reverse biased pn junction. As a result, if the area of the junction surface is assumed to be equal, an oscillating frequency lower than that of the case provided with no region 51 can be obtained, and on the other hand if the frequency is assumed to be equal, the element can be miniaturized.

The circuit shown in FIG. 5 differs from that shown in FIG. 3 in the following two points. Firstly, the output terminals 52 and 53 are connected to electrodes 11 and 32, respectively. Between the terminals 52 and 53, an output voltage appears having a saw-tooth waveform, corresponding to charge and discharge of the capacitor. Accordingly, this output voltage can be utilized for a sweeping operation. Secondarily, a variable resistor 54 is connected in series to the electric power source 15. When the resistance value of the resistor 54 is controlled, the voltage applied across the electrodes 9 and 11 can be varied, whereby the oscillating frequency is varied, as will be understood from FIG. 12.

In this circuit also, adjustment of the oscillating frequency or conversion of a physical quantity to an oscillating frequency can be attained by utilizing the variable voltage source 34 and the variable resistor 54.

Figure 7:
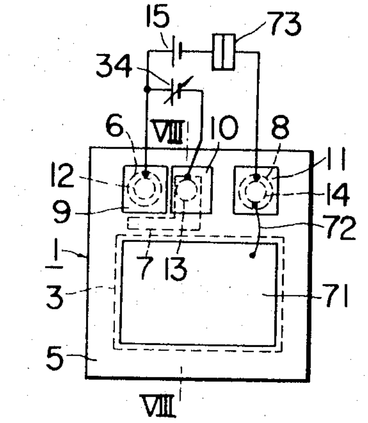
Figure 8:
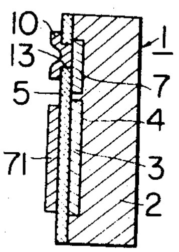

The semiconductor oscillating element shown in FIGS. 7 and 8 is substantially the same as the element shown in FIGS. 1 and 2 except that in the former element, a metal film 71 is formed on the oxide film 5 by means of evaporation of a metal such as aluminum in such a manner that said film 71 covers the region 3, said metal film 71 being connected by using the electrode 11 and a lead wire 72. The film 71 may be connected to the electrode 9 or to either one of the electrodes 9 and 11 through a resistor. The film 71 may be unified with either one of the electrodes 9 and 11.

The film 71 forms a kind of capacitor together with the region 3 by utilizing the oxide film 5 as an insulating layer of said capacitor. This capacitor is additional to the capacitor formed between the regions 2 and 3, so that as in the element shown in FIGS. 5 and 6, a decrease of the oscillation frequency or miniaturization of the element may be attained.

The difference between the operation circuit of the element shown in FIG. 7 and that shown in FIGS. 5 and 6 is such that an electro-luminescent diode 73 is connected in series to the electric power source 15. According to the circuit shown in FIG. 7, a periodically blinking light can be obtained as its output. If an electromagnet is connected in place of the diode 73, a periodically increasing and decreasing magnetic flux can be obtained as its output. Accordingly, the invention can be effectively utilized in such a manner that an oscillating current produced by the semiconductor oscillating element can be directly converted to appropriate physical quantities other than voltage.

Figure 9:
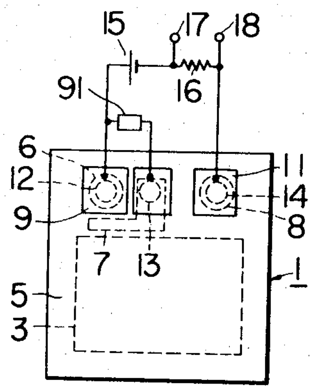

The semiconductor oscillating element illustrated in FIG. 9 has entirely the same structure as that of the element illustrated in FIGS. 1 and 2, but said former circuit shows the manner of use of the second ohmic contact-electrode means, which is entirely different from that of the circuit illustrated in FIG. 1. Namely, in the circuit shown in FIG. 9, a positive temperature coefficient thermistor 91 with a low resistance having initimate thermal contact to the element is connected between the electrodes 9 and 10 and is utilized for suppressing or decreasing such a variation of the oscillating frequency as being caused by the temperature variation of the semiconductor oscillating element. The reason is as follows; As the resistance of the region 2 in the semiconductor oscillating element increases with the temperature, the minority carrier current into the region 2 from the region 6 decreases. Because of this thermal effect, the oscillating frequency has a relatively large negative temperature coefficient. Therefore, when the element is used under a condition liable to present temperature variation, an appropriate procedure is necessary for obtaining an output stabilized for temperature variation, for instance a predetermined oscillating frequency or frequency responding correctly to a physical quantity.

In the circuit shown in FIG. 9, illustrating a manner of carrying out temperature compensation in a most simple method, the thermistor 91 having a positive temperature coefficient forms a bypass of the pn junction formed between the regions 1 and 2. When the temperature of the element is low, the resistance of the thermistor 91 is low and a part of the current supplied from the electric power source 15 flows through said thermistor, whereby the minority carrier current injected from the region 6 is effectively suppressed. However, with an increase of the element temperature, the resistance of the thermistor 91 increases rapidly, whereby the minority carrier current injected from the region 6 to the region 2 is increased, thus preventing lowering of the oscillating frequency and maintaining said frequency at a substantially constant value.

Figure 15:
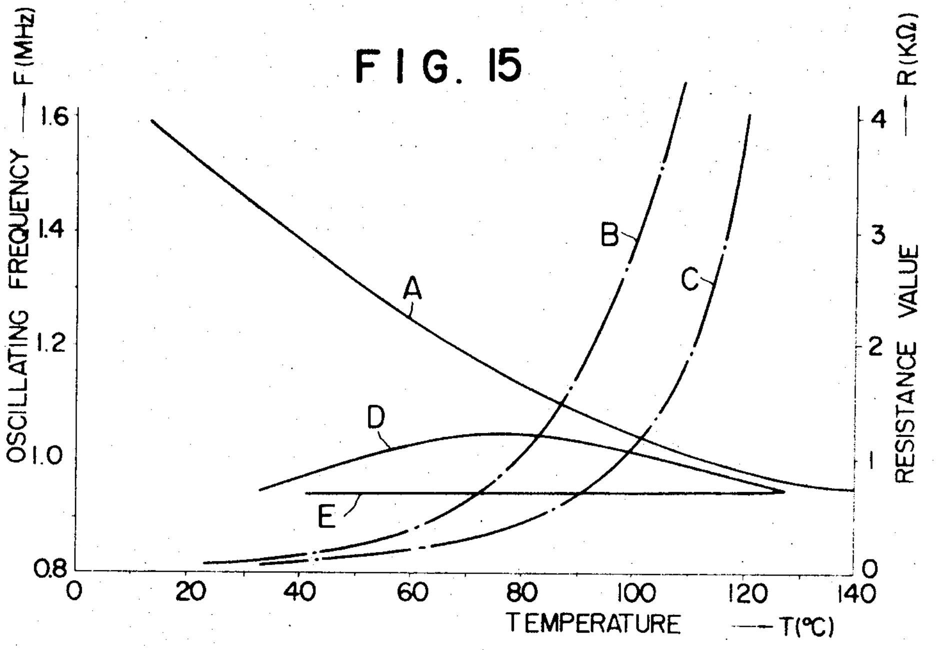
FIG. 15 is a graphic diagram for describing state of temperature compensation of the oscillating frequency in the device shown in FIG. 9.

FIG. 15 shows temperature compensating characteristic curves, in which the abscissa shows the temperature T(°C) of the element and the thermistor having a positive temperature coefficient, and the ordinate shows the oscillating frequency F(MHz) of the element and the resistance value R (KΩ) of said thermistor. In FIG. 15, the solid line A indicates variation of the oscillating frequency in response to temperature variation in the case when temperature compensation is not adopted. The chain lines B and C indicate, respectively, resistance versus temperature characteristics of the thermistor having a positive temperature coefficient thermistor. The solid lines indicate the relationships between the oscillating frequency and temperature; A for the case when the above-mentioned temperature compensation is not adopted and D and E when the temperature compensation by the thermistor B and C respectively is adopted.

According to the characteristic curves, it will be understood that variation of the oscillating frequency due to temperature variation can be decreased or completely eliminated by carrying out the temperature compensation.

Of course, the above-mentioned temperature compensation can be applied to the elements and circuits illustrated in FIGS. 3 to 8.

Figure 10:
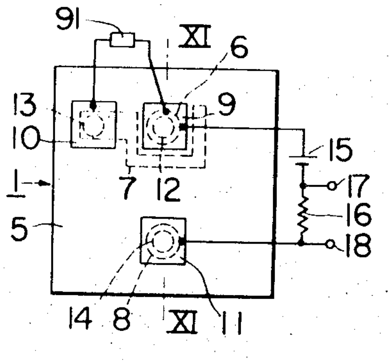
Figure 11:
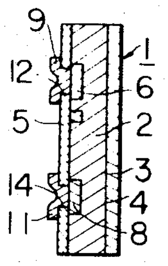

The semiconductor oscillating element illustrated in FIGS. 10 and 11 differs from the elements illustrated and described in connection with FIGS. 1 to 9 in only the fact that the region 2 of reverse conductivity type is provided at the side face opposite to the region where the electrodes 9, 10 and 11 are provided. According to the structure shown in FIGS. 10 and 11, so far as the distances between the regions 2, 6 and 8 are selected within predetermined ranges, the same oscillating phenomenon as those of the previously described embodiments can be produced. The operating circuit of the element illustrated in FIGS. 10 and 11 is the same as that of the element shown in FIG. 9, and the temperature compensation of the frequency of the output voltage produced between the terminals 15 and 16 is attained by a thermistor having a positive temperature coefficient. Furthermore, in the element shown in FIGS. 10 and 11 it is possible to provide, additionally, a control electrode and/or means adapted to increase the capacitance between the regions 2 and 3, as the elements already mentioned.

In the embodiments mentioned above, silicon is used as a material, but other semiconductor materials such as germanium, metallic compound and the like may be used for this purpose. Furthermore, in the embodiments mentioned above, a conductivity type region and a reverse conductivity region are made, respectively, to be n-type and p-type, but their conductivity types may be reversed. Moreover, a hetero-junction may be utilized as the injection electrode means in place of the pn junction.

We claim:

1. A semiconductor oscillating element comprising a semiconductor wafer which comprises, in combination, a first region of a conductivity type, a second region of a reverse conductivity type disposed on said first region adjacent a surface of said wafer, a pn junction formed between said both regions, an injection electrode means provided on said region of said first conductivity type adjacent said wafer surface at a specific lateral distance from said second region which is of the order of the diffusion length of a minority carrier in said first region, a first ohmic contact-electrode means provided on said first region adjacent said wafer surface at a specific lateral distance from said second region which is of the order of the diffusion length of said minority carrier and at a lateral distance from said injection electrode means which is sufficiently larger than said diffusion length, and a second ohmic contact-electrode means provided adjacent said wafer surface and adjacent said injection electrode means.

2. A semiconductor oscillating element as claimed in claim 1, in which the second ohmic contact-electrode means comprises a low resistance region of the same conductivity type as that of the first region and a part of said contact-electrode means extends into the portion of the first region, said portion being positioned at said wafer surface between the injection electrode means and the second region.

3. A semiconductor oscillating element as claimed in claim 1, in which said second region is provided with another ohmic contact-electrode.

4. A semiconductor oscillating element as claimed in claim 1, in which a specific region having a resistivity lower than that of the first region and having the same conductivity type as that of said first region is provided so that said specific region is sandwiched between the first and second regions and in direct contact with said second region.

5. A semiconductor oscillating element as claimed in claim 1, in which an insulating film is provided in such a manner that said film covers the exposed surface of at least second region of the semiconductor wafer, and a metal film is formed on said insulating film.

* * * * *